US006992392B2

(12) United States Patent
Mori

(10) Patent No.: US 6,992,392 B2
(45) Date of Patent: Jan. 31, 2006

(54) SEMICONDUCTOR DEVICE AND METHOD FOR MANUFACTURING THE SAME

(75) Inventor: Katsumi Mori, Sukatu (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/227,189

(22) Filed: Aug. 23, 2002

(65) Prior Publication Data

US 2003/0042611 A1 Mar. 6, 2003

(30) Foreign Application Priority Data

Aug. 23, 2001 (JP) ............................ 2001-252728

(51) Int. Cl.
*H01L 23/48* (2006.01)

(52) U.S. Cl. ...................................................... 257/758

(58) Field of Classification Search ................ 257/750, 257/758, 760, 771, 773

See application file for complete search history.

(56) References Cited

U.S. PATENT DOCUMENTS

| | | | | |
|---|---|---|---|---|
| 4,916,514 | A | 4/1990 | Nowak | |
| 5,556,805 | A | 9/1996 | Tanizawa et al. | |
| 5,597,668 | A | 1/1997 | Nowak et al. | |
| 5,786,624 | A * | 7/1998 | Havemann et al. | 257/635 |
| 5,790,417 | A | 8/1998 | Chao et al. | |
| 5,798,298 | A | 8/1998 | Yang et al. | |
| 5,885,856 | A | 3/1999 | Gilbert et al. | |
| 5,902,752 | A | 5/1999 | Sun et al. | |
| 5,923,074 | A * | 7/1999 | Jeng | 257/522 |
| 6,103,626 | A * | 8/2000 | Kim | 438/691 |
| 6,194,249 | B1 * | 2/2001 | Chen et al. | 438/115 |
| 6,384,464 | B1 * | 5/2002 | Shin | 257/503 |
| 6,573,168 | B2 * | 6/2003 | Kim et al. | 438/586 |
| 2001/0039647 | A1 | 11/2001 | Mori et al. | |
| 2001/0042921 | A1 | 11/2001 | Mori et al. | |
| 2002/0111014 | A1 * | 8/2002 | Jeng et al. | 438/631 |

FOREIGN PATENT DOCUMENTS

| | | | | |
|---|---|---|---|---|
| JP | 64-057645 | | | 3/1989 |
| JP | 04218918 | A | | 8/1992 |
| JP | 11026576 | A | * | 1/1997 |
| JP | 09107028 | A | | 4/1997 |
| JP | 0981159 | A | | 7/1997 |
| JP | 9-213800 | | | 8/1997 |
| JP | 09153550 | A | * | 10/1997 |
| JP | 10092921 | A | * | 10/1998 |
| JP | 10335333 | A | | 12/1998 |
| JP | 2001-267322 | | | 9/2001 |
| JP | 2001-267415 | | | 9/2001 |

OTHER PUBLICATIONS

Examination Report for corresponding Japanese Application EP-0319001.

* cited by examiner

*Primary Examiner*—Leonardo Andujar
(74) *Attorney, Agent, or Firm*—Harness, Dickey & Pierce, P.L.C.

(57) ABSTRACT

A semiconductor device 100 includes wiring layers 12 disposed in a specified pattern on a base 10, and an interlayer dielectric layer 20 that covers the wiring layers 12. The interlayer dielectric layer 20 includes a stress relieving dielectric layer 22 disposed in a specified pattern on the base 10, and a planarization dielectric layer 26 that covers the wiring layers 12 and the stress relieving dielectric layers 22, and is formed from a liquid dielectric member. The interlayer dielectric layer 20 may further include a base dielectric layer 24 and a cap dielectric layer 28.

7 Claims, 3 Drawing Sheets

SEMICONDUCTOR DEVICE AND METHOD FOR MANUFACTURING THE SAME

BACKGROUND OF THE INVENTION

1. Technical Field of the Invention

The present invention relates to semiconductor devices and methods for manufacturing the same, and more particularly to a semiconductor device having an interlayer dielectric layer in which the dielectric layer is well embedded between wiring layers even when the gap between the wiring layers is particularly narrow, and a method for manufacturing the same.

2. Background Technology and Problems to be Solved By the Invention

In semiconductor devices such as LSIs, the width of wiring layers has become small and the gap between the wiring layers has also become narrow due to further device miniaturization, higher densification, and greater number of multiple layers. For example, in the 0.13 $\mu$m generation design rule, the minimum line width of a metal wiring layer is 0.2 $\mu$m, and the minimum gap is 0.22 $\mu$m. When silicon oxide is embedded by a CVD method in such a narrow gap between the wiring layers, voids may be generated in the embedded silicon oxide layer because the gap between the wiring layers is too narrow, resulting in an embedding failure.

Coated silicon oxide called SOG (Spin On Glass) is provided by spin-coating a wafer with a dielectric film material dissolved in an organic solvent, and then hardening the layer by a heat treatment. Such a SOG is excellent in its embedding property due to its high fluidity. However, when the SOG is subject to a heat treatment for thermosetting, which is called "curing", the SOG layer shrinks as the organic solvent evaporates.

The inventors of the present invention have confirmed that, when a SOG layer is used as an interlayer dielectric layer between wiring layers that are formed according to, for example, the 0.13 $\mu$m generation design rule, a shrinkage occurs in the SOG layer, and causes a compression force against the wiring layers in their thickness direction, which would likely deform metal wiring layers such as aluminum layers in particular. When wiring layers are deformed, the wiring reliability and migration resistivity may lower. In addition, deformations in wiring layers would occur particularly in wiring layers having patterns that are isolated from others.

It is an object of the present invention to provide a semiconductor device having an interlayer dielectric layer with an excellent embedding property for gaps between adjacent wiring layers even when they are formed in accordance with, for example, a sub 0.13 $\mu$m generation design rule, and a method for manufacturing the same.

SUMMARY OF THE INVENTION

A semiconductor device in accordance with the present invention comprises a wiring layer disposed in a specified pattern on a base, and an interlayer dielectric layer that covers the wiring layer, wherein the interlayer dielectric layer comprises:

a stress relieving dielectric layer disposed in a specified pattern on the base, and a planarization dielectric layer that covers the wiring layer and the stress relieving dielectric layer and is formed from a liquid dielectric material.

The semiconductor device in accordance with the present invention comprises a stress relieving dielectric layer having a specified pattern between wiring layers. As a result, even when a planarization dielectric layer that is embedded in gaps between the wiring layers causes a compression force that works on the wiring layers, the compression force is absorbed by the stress relieving dielectric layer. As a result, the compression force that works on the wiring layers can be diminished, and deformations of the wiring layers by the compression force can be prevented. The stress relieving dielectric layer may be disposed in such a manner mainly to relieve compression forces that may be applied to the wiring layers due to the planarization dielectric layer. The present invention is preferably applied to layers in which a metal wiring layer that is apt to deform by a compression force is formed.

The planarization dielectric layer may be a silicon oxide layer or another dielectric layer having a low dielectric constant formed by a coating method. Here, the "dielectric layer having a low dielectric constant" is a layer typically having a relative dielectric constant of 3.0 or lower.

The stress relieving dielectric layer may preferably have a higher density and greater mechanical strength than those of the planarization dielectric layer, and may be composed of a silicon oxide layer formed by, for example, a CVD method.

Also, the stress relieving dielectric layer may be disposed at least in a rough or sparse pattern region. Wiring layers in a rough pattern region would more likely be affected by a compression force caused by a planarization dielectric layer compared to those in a dense pattern region, and therefore the necessity to provide a stress relieving dielectric layer in the rough pattern region is high. Here, the "dense pattern region" means a region with a high wiring density in which wiring layers are disposed, for example, at the minimum gaps according to an applied design rule. Also, the "rough pattern region" means, for example, a region in which wiring layers present are isolated from other wiring layers or a region with a lower wiring density than that of the dense pattern region. Also, the "design rule" in accordance with the present invention means a variety of design rules stipulated in the ITRS (International Technology Roadmap for Semiconductor) 2000.

The stress relieving dielectric layer may have, in accordance with the applied design rule, a minimum line width and a minimum gap for wiring layers on which the stress relieving dielectric layer is formed. Also, the stress relieving dielectric layer may have a pattern that is different from a so-called dummy pattern that is provided to prevent generation of dishing in a chemical mechanical polishing (CMP) process.

Furthermore, the stress relieving dielectric layer may be formed higher than the wiring layer, and an upper surface of the stress relieving dielectric layer may be located higher than an upper surface of the wiring layer. Because the height of the stress relieving dielectric layer is greater than the wiring layer, a compression force by the planarization dielectric layer preferentially acts on the stress relieving dielectric layer, such that the influence of the compression force caused by the planarization dielectric layer on the wiring layer can be further diminished.

The interlayer dielectric layer may further comprise a base dielectric layer formed on the wiring layer and the stress relieving dielectric layer, and a cap dielectric layer formed on the planarization dielectric layer.

A method for manufacturing a semiconductor device in accordance with the present invention includes a wiring layer disposed in a specified pattern on a base, and an interlayer dielectric layer that covers the wiring layer, the method comprising the steps of:

forming the wiring layer having a specified pattern on the base;

forming the interlayer dielectric layer;

forming a stress relieving dielectric layer in a specified pattern on the base; and forming a planarization dielectric layer with a liquid dielectric material to cover the wiring layer and the stress relieving dielectric layer.

The step of forming a planarization dielectric layer may be performed by a coating method, or a liquid CVD method.

The step of forming a stress relieving dielectric layer may include the steps of depositing a dielectric layer on the base to cover the wiring layer, and then patterning the dielectric layer.

The step of forming an interlayer dielectric layer further may include the steps of forming a base dielectric layer on the wiring layer and the stress relieving dielectric layer, and forming a cap dielectric layer on the planarization dielectric layer.

DETAILED DESCRIPTION OF THE PREFERRED EMBODIMENTS OF THE PRESENT INVENTION

One exemplary embodiment of the present invention will be described below with reference to the accompanying drawings.

[Device]

Figure 4:
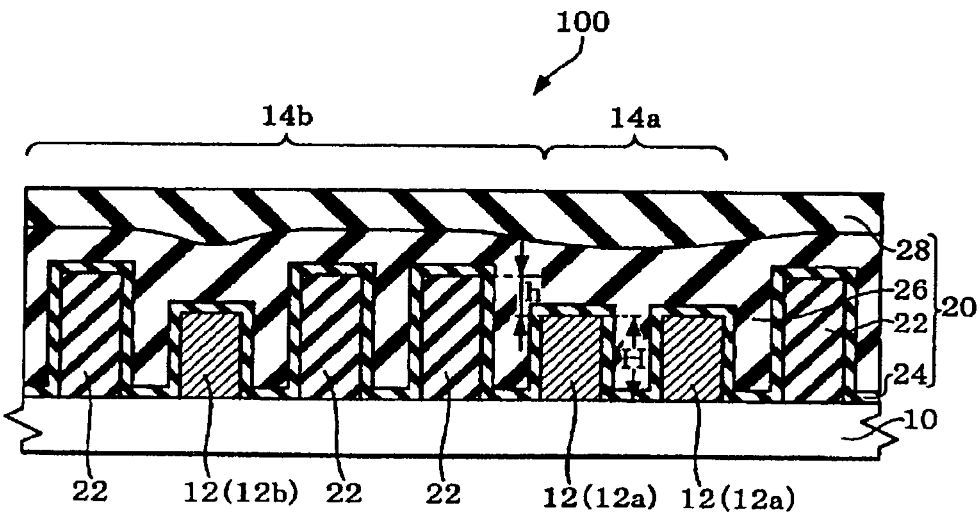
FIG. 4 schematically shows a cross-sectional view of a semiconductor device in accordance with the present invention.

First, a semiconductor device in accordance with the present embodiment will be described. FIG. 4 schematically shows a cross-sectional view of a main part of a semiconductor device 100 of the present embodiment, and FIG. 5 schematically shows a plan view of a part of the layers of the semiconductor device 100.

The semiconductor device 100 includes a base 10, wiring layers 12 (12*a*, 12*b*) formed on the base 10, and an interlayer dielectric layer 20 that is formed in a manner to cover the wiring layers 12. Here, the "base" indicates a structural body below one interlayer dielectric layer 20. For example, when the interlayer dielectric layer 20 is an interlayer dielectric layer in the second layer, the base 10 may be formed, although not shown, from a semiconductor substrate, and an element isolation region, a semiconductor element such as a MOSFET and wiring layers formed on the semiconductor substrate, and an interlayer dielectric layer in the first layer. The interlayer dielectric layer 20 in which the present invention is applied may be an interlayer dielectric layer at any location; but in particular, it may preferably be an interlayer dielectric layer for covering a metal wiring layer.

Figure 5:
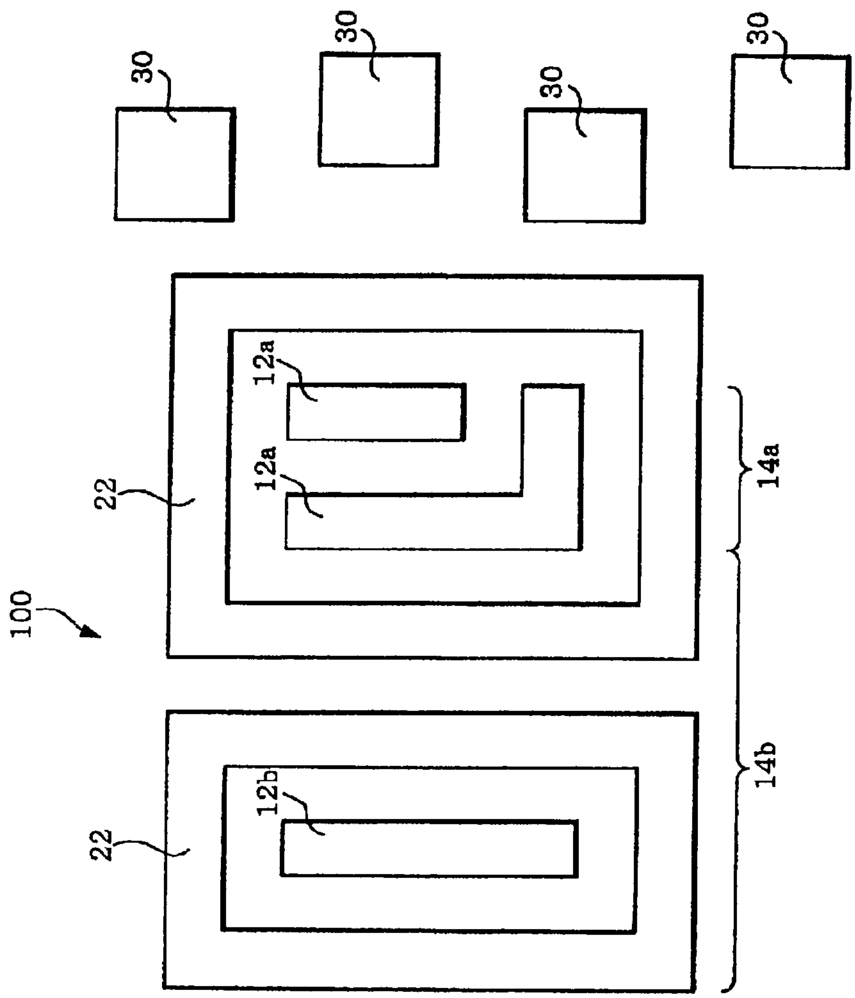
FIG. 5 schematically shows a plan view a semiconductor device in accordance with the present invention.

The example in FIG. 4 and FIG. 5 shows wiring layers 12*a* in a dense pattern region 14*a* and a wiring layer 12*b* in a rough or sparse pattern region 14*b*. The wiring layers 12*a* and 12*b* may be formed from metal material mainly selected, for example, from aluminum, aluminum alloy, copper or copper alloy.

The interlayer dielectric layer 20 that covers the wiring layers 12 includes stress relieving dielectric layers 22, a base dielectric layer 24, a planarization dielectric layer 26 and a cap dielectric layer 28.

The stress relieving dielectric layers 22 having a specified pattern are disposed on the base 10 between the wiring layers 12. The pattern of the stress relieving dielectric layers 22 is not limited to a particular pattern, and may be, for example, continuous as indicated in FIG. 5, or may be composed of blocks of dielectric layers disposed in a discontinuous manner. Preferably, the stress relieving dielectric layer 22 may continuously extend at least in a direction in which the wiring layers 12 extend (in a length direction) as indicated in FIG. 5, in view of the function of relieving stresses. By disposing the stress relieving dielectric layer 22 in such a manner, stresses can be uniformly absorbed.

The stress relieving dielectric layers 22 are formed at least in the rough pattern region 14*b*. In other words, the stress relieving dielectric layers 22 may be disposed such that, when disposed between the wirings 12, the influence of compression forces of the planarization dielectric layer 26 that work on the wiring layers 12 can be suppressed, and deformations of the wiring layers 12 can be prevented. Also, the stress relieving dielectric layers 22 may be formed with the minimum gap and minimum line width for wiring layers according to the applied design rule. For example, according to the 0.13 $\mu$m generation design rule, the minimum line width of metal wiring layers is 0.20 $\mu$m, and the minimum gap is 0.22 $\mu$m. By forming the stress relieving dielectric layers 22 according to such a rule, the stress relieving dielectric layers with miniature patterns can be formed, which can suppress the influence of compression forces of the planarization dielectric layer 26 that may act on the wiring layers 12 to a minimum level.

Stress relieving layers in accordance with the present invention differ in the following aspects from so-called dummy patterns that are formed to improve planarization in a CPM process. Since dummy patterns are formed to improve the degree of flatness of the entire surface of a substrate, or to improve the uniformity in polishing the entire surface in a CMP process, such dummy patterns are disposed regularly across the entire surface of a wafer. In contrast, stress relieving dielectric layers in accordance with the present invention can be provided in any specific areas to achieve the stress relieving function described above, and may not be disposed regularly across the entire surface of a wafer.

The stress relieving dielectric layer 22 may be formed from a silicon oxide layer that can be obtained by a CVD method, such as, for example, a $SiH_4$—$O_2$ group normal pressure CVD, $SiH_4$—$N_2O$ group CVD, TEOS—$O_2$ group plasma CVD, $SiH_4$—$O_2$ group high-density plasma CVD or the like. The kinds of gases that are used for each of the CVD methods are not limited to those mentioned above, but can be any of various kinds of gases. Also, fluoride may be introduced in those gases in order to improve the embedding property.

Furthermore, the stress relieving dielectric layers 22 may preferably have a height that is the same as or greater than the height H of the wiring layers 12, as shown in FIG. 4. When the height of the stress relieving dielectric layers 22 is higher than that of the wiring layers 12, a compression force of the planarization dielectric layer 26 preferentially acts on the stress relieving dielectric layers 22, such that the influence of the compression force caused by the planarization dielectric layer 26 on the wiring layers 12 can be further diminished. More specifically, a protrusion height of the stress relieving dielectric layers 22 (i.e., a height h from an upper surface of the wiring layers 12 to an upper surface of the stress relieving dielectric layers 22) may be set at $0 \leqq h \leqq H/2$, when the wiring layers 12 have a height H, in view of relieving the compression force of the planarization dielectric layer 26 described above. When the protrusion height of the stress relieving dielectric layers exceeds a value of H/2, the gap between the wiring layers 12 and the stress relieving dielectric layers 22, or an aspect ratio of a space between one stress relieving dielectric layer 22 and an adjacent stress relieving dielectric layer 22 becomes large, which may cause the planarization dielectric layer 26 to present an insufficient embedding property.

Also, the stress relieving dielectric layers 22 can have the above-described function to relieve compression forces of the planarization dielectric-layer 26 as well as a function of dummy patterns that prevent a polishing failure called "dishing" in a CMP process. Depending on the requirements, dummy patterns 30 for a CMP process, which have a pattern different from the pattern of the stress relieving dielectric layers 22, may be provided as shown in FIG. 5. In this case, the dummy patterns 30 may be dielectric layers formed from the same material as that of the stress relieving dielectric layers 22, or may be formed from the same material as that of the wiring layers 12. In view of short-circuit or wiring capacitance of the wiring layers, the dummy patterns 30 may preferably be formed from dielectric layers made of the same material as that of the stress relieving dielectric layers 22. In this case, the dummy patterns 30 can be formed by the same process that form the stress relieving dielectric layers 22. In the example shown in the figure, the dummy patterns 30 have a greater width than that of the stress relieving dielectric layers 22. For example, they are rectangular patterns having a size of 2.0 μm, and regularly disposed.

The base dielectric layer 24 is a layer that is formed to avoid direct contact between the wiring layers 12 and the planarization dielectric layer 26. The planarization dielectric layer 26 to be described later in detail generally has a porous structure and high moisture absorbability. Therefore, when the planarization dielectric layer 26 directly contacts the wiring layers, the wiring layers may be corroded, or cracks may be generated in the interlayer dielectric layer as the layer itself is weak. To avoid such problems, normally, the base dielectric layer 24 can be formed by a silicon oxide layer that is dense and has a great mechanical strength. Such a silicon oxide layer can be obtained by a CVD method such as a normal pressure CVD, plasma CVD, or high-density plasma CVD, like the stress relieving dielectric layers 22. Also, the base dielectric layer 24 has a thickness that can provide the functions described above, for example,10–50 nm.

The planarization dielectric layer 26 is formed from a liquid dielectric member having an excellent step covering property. Such a liquid dielectric member may be generally grouped into SOG that is obtained by a coating method and silicon oxide that is obtained by a liquid CVD. The material of the planarization dielectric layer 26 may be either SOG or silicon oxide that is formed by a liquid CVD method, and may preferably be SOG because it can be formed with a relatively simple facility and therefore is highly economical.

Silicon oxide formed by the SOG or liquid CVD method may not be particularly limited, and may be any one of those ordinarily used.

The SOG may be formed by spin-coating dielectric material that is dissolved in an organic solvent on a wafer, and then conducting a heat treatment after the coating step. A typical heat treatment is composed of heat treatment for removing the solvent, which is called "baking", and heat treatment for thermosetting, which is called "curing". The SOG is generally grouped into organic SOG and inorganic SOG. The inorganic SOG includes silicate groups, alkoxy silicate groups, and polysilazane groups.

In the liquid CVD, a liquid reaction intermediate is deposited on the base, and then the reaction intermediate is changed to a complete oxide film by a heat treatment or the like. The methods listed below are known as the type of liquid CVD method described above:

(a) Thermal CVD with TEOS and $O_3$ (Temperature: about 400° C.)

(b) Plasma reaction with Si $(CH_3)_4$ and $O_2$ (Substrate temperature: from −20° C. to −40° C.)

(c) Plasma reaction with TEOS and $H_2O$ (Substrate temperature: from 60° C. to 120° C.)

(d) Plasma reaction with $SiH_4$ and $O_2$ (Substrate temperature: −80° C. or lower)

(e) Heat treatment reaction with $SiH_4$ and $H_2O_2$ (Substrate temperature: about 0° C.) under reduced pressure As to the planarization dielectric layer 26 that is formed from a liquid dielectric material, the layer is formed on the base in a liquid state in the SOG process, and in a state of liquid reaction intermediate in the liquid CVD, and thus the layer has an excellent step covering property. As a result, a dielectric layer having a good embedding property can be formed without generating voids even in gaps between the wiring layers 12*a* and 12*a* in the dense pattern region 14*a* where the layers are disposed with the minimum gap according to, for example, a sub 0.13 μm generation design rule. Also, a dielectric layer having an excellent embedding property can be formed not only in the gaps between the wiring layers 12, but also gaps between the wiring layers 12 and the stress relieving dielectric layers 22, and gaps between the adjacent stress relieving dielectric layers 22.

The cap dielectric layer 28 is formed in contact with the planarization dielectric layer 26 for the same reasons described above in conjunction with the base dielectric layer 24. When the interlayer dielectric layer 20 is planarized by a CMP process, the cap dielectric layer 28 is formed with a film thickness that takes into account a thickness to be polished by the CMP. Also, the same film growth method and material for the base dielectric layer 24 may be used for the cap dielectric layer 28.

With the semiconductor device in accordance with the present invention, the following effects are achieved.

The semiconductor device 100 in accordance with the embodiment of the present invention includes the stress relieving dielectric layer 22 having a specified pattern between the wiring layers 12, in particular, in the rough pattern region 14*b*. For this reason, even when compression forces caused by the planarization dielectric layer 26 that is embedded between the wiring layers 12 work on the wiring layers 12, the compression forces are absorbed by the stress relieving dielectric layer 22. As a result, the compression forces that may work on the wiring layers 12 can be diminished relatively, and deformations of the wiring layers 12 by the compression forces can be prevented. For example, when wiring layers are formed according to a sub 0.13 $\mu$m generation design rule, and a minimum gap between the wirings is 0.18–0.22 $\mu$m, a compression force caused by the planarization dielectric layer 26 would not deform or crush the wiring layers.

In the semiconductor device 100 in accordance with the embodiment of the present invention, the stress relieving dielectric layers 22 that are disposed between the wiring layers 12 are formed from dielectric layers such as silicon oxide layers, such that problems such as short-circuit would not occur even when they are placed between the wiring layers 12 disposed at narrow pitches. Also, as the stress relieving dielectric layers 22 are not composed of conductive members such as metal, they would not increase the wiring capacitance, and therefore would not practically contribute to the transmission delay of electrical signals.

With the semiconductor device 100 in accordance with the embodiment of the present invention, even when the planarization dielectric layer 26 is used that has difficulty obtaining a large mechanical strength, the stress relieving dielectric layers 22 that are present with a certain density among the planarization dielectric layer 26 absorb its shrinking force (i.e., a compression force against the wiring layers 12 and the stress relieving dielectric layers 22), such that cracks are not generated in the planarization dielectric layer 26.

Also, the stress relieving dielectric layers 22 can function as dummy patterns that prevent a polishing defect which is called dishing in a CMP process.

[Manufacturing Method]

Figure 1:
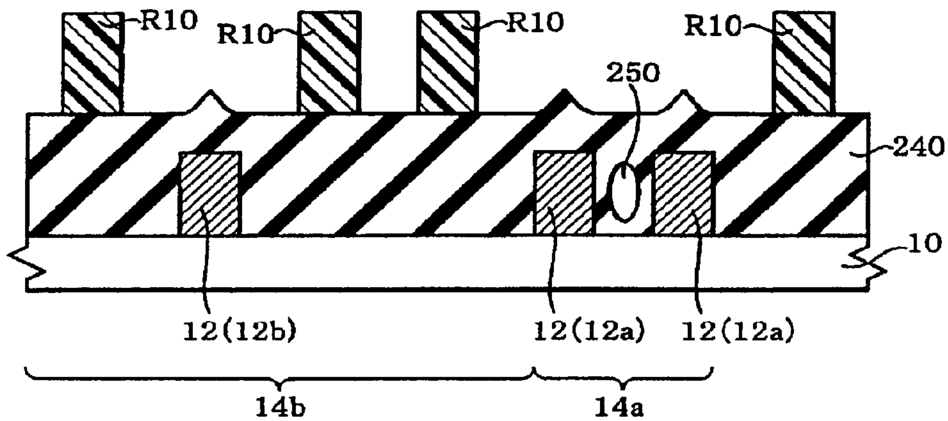
FIG. 1 schematically shows in cross section a step of a method for manufacturing a semiconductor device in accordance with an embodiment of the present invention.
Figure 2:
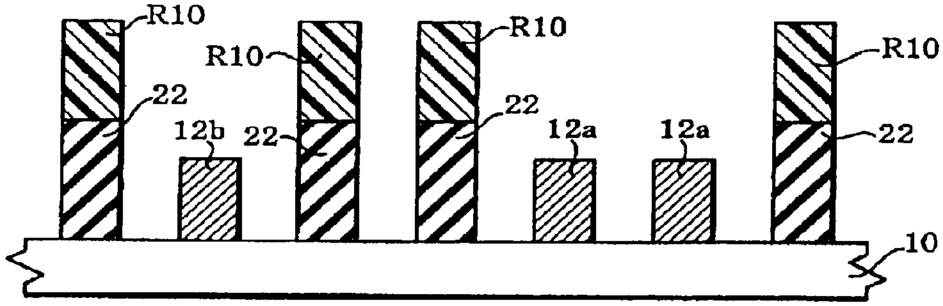
FIG. 2 schematically shows in cross section a step of the method for manufacturing a semiconductor device in accordance with the present invention.
Figure 3:
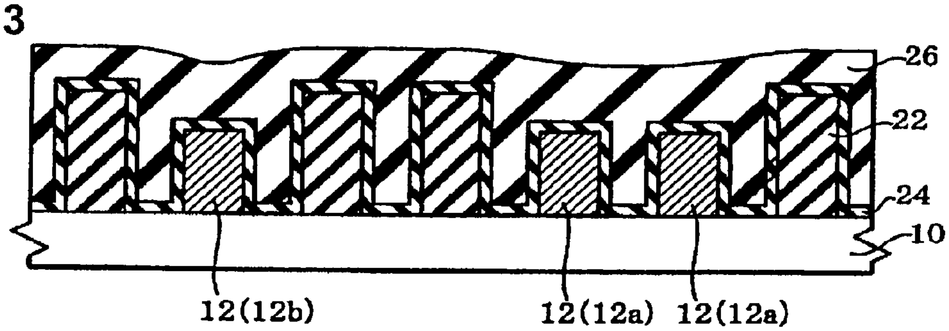
FIG. 3 schematically shows in cross section a step of the method for manufacturing a semiconductor device in accordance with the present invention.

Next, one example of a method for manufacturing the semiconductor device 100 shown in FIGS. 4 and 5 will be described. FIGS. 1–3 schematically show in cross section steps of the manufacturing method.

As shown in FIG. 1, a conductive layer composed of metal or the like is formed on a base 10, and then the conductive layer is patterned by generally practiced lithography and etching to form wiring layers 12. In the example shown in FIG. 1, the wiring layers 12 in a dense pattern region 14*a* are indicated with reference numerals "12*a*", and the wiring layers 12 in a rough pattern region 14*b* are indicated with reference numerals "12*b*". Metal that composes the conduction layer has been described above, and its description is not repeated.

Then, a silicon oxide layer 240 is formed over the entire surface of the base 10 by a CVD method. The silicon oxide layer 240 is formed in a manner to cover at least the wiring layers 12. For the CVD method, a normal pressure CVD, a plasma CVD, a high-density plasma CVD or the like described above can be used. Even when the silicon oxide layer 240 is formed by, for example, a high-density plasma CVD which generally provides an excellent embedding property, voids 250 are apt to be formed between the wiring layer 12*a* and the wiring layer 12*a* that are formed at minimum wiring layer gaps.

Then, a resist layer R10 having a specified pattern is formed on the silicon oxide layer 240 by a known method.

(b) Next, as shown in FIG. 2, the silicon oxide layer 240 shown in FIG. 1 is etched using the resist layer R10 as a mask, to form stress relieving dielectric layers 22. In this instance, the silicon oxide layers between the wiring layers 12*a*, 12*a* that are disposed at minimum gaps are also removed. As a result, the voids 250 shown in FIG. 1 are also eliminated.

Then, the resist layer R10 is removed by a known method such as ashing.

The pattern of the stress relieving dielectric layers 22 has already described above, and its description is not repeated.

(c) Next, as shown in FIG. 3, a base dielectric layer 24 is formed over the entire surface of the base 10 on which the wiring layers 12 (12*a*, 12*b*) and the stress relieving dielectric layers 22 are formed. Then, a planarization dielectric layer 26 composed of a liquid dielectric member is formed on the base dielectric layer 24. The planarization dielectric layer 26 is formed in a manner to cover at least the base dielectric layer 24, and fill gaps between the wiring layers 12, between the wiring layers 12 and the stress relieving dielectric layers 22 and between the stress relieving dielectric layers 22 with the dielectric layers.

(d) Then, as shown in FIG. 4, a cap dielectric layer 28 is formed over the entire surface of the planarization dielectric layer 26. The cap dielectric layer 28 has a thickness that sufficiently fills the surface roughness of the planarization dielectric layer 26, plus a thickness that is polished by a CMP process as necessary. The example shown in FIG. 4 indicates a state in which the top surface of the cap dielectric layer 28 has been planarized by a CMP process.

An embodiment of the present invention has been described. However, the present invention is not limited to this embodiment, and many modifications can be made within the scope of the subject matter of the present invention. The present invention can also be used in cases where a dielectric layer with a low dielectric constant formed by a coating method or a liquid CVD method is used as an interlayer dielectric layer.

The entire disclosure of Japanese Patent Application No. 2001-252728 filed Aug. 23, 2001 is incorporated by reference.

What is claimed is:

1. A semiconductor device comprising:

a base;

at least one wiring layer disposed on the base;

a stress relieving dielectric layer disposed on the base, the stress relieving dielectric layer having four contiguous strips forming a rectangular shape with each of the four strips having a constant cross-section in a direction parallel to the base;

a planarization dielectric layer disposed above the wiring layer and the stress relieving layer; and wherein the wiring layer is separated from, and surrounded by the stress relieving dielectric layer.

2. A semiconductor device according to claim 1, wherein the planarization dielectric layer further comprises at least one of a silicon oxide layer and another dielectric layer having a low dielectric constant.

3. A semiconductor device according to claim 1, wherein the stress relieving dielectric layer further comprises a silicon oxide layer.

4. A semiconductor device according to claim 1, wherein the stress relieving dielectric layer is disposed at least in a rough pattern region.

5. A semiconductor device according claim 1, wherein the stress relieving dielectric layer has a minimum line width and a minimum gap for a wiring layer in an applied design rule.

6. A semiconductor device according to claim 1, wherein the stress relieving dielectric layer is formed higher than the wiring layer, and an upper surface of the stress relieving dielectric layer is located higher than an upper surface of the wiring layer.

7. A semiconductor device according to claim 1, further comprising:

a base dielectric layer formed on the wiring layer and the stress relieving dielectric layer; and a cap dielectric layer formed on the planarization dielectric layer.

* * * * *

UNITED STATES PATENT AND TRADEMARK OFFICE

CERTIFICATE OF CORRECTION

PATENT NO. : 6,992,392 B2
DATED : January 31, 2006
INVENTOR(S) : Katsumi Mori

It is certified that error appears in the above-identified patent and that said Letters Patent is hereby corrected as shown below:

Title page,
Item [56], References Cited, FOREIGN PATENT DOCUMENTS,
"JP 0981159" should be -- JP 09181159 --.

Signed and Sealed this

Twenty-third Day of May, 2006

JON W. DUDAS
*Director of the United States Patent and Trademark Office*